United States Patent
Kubota et al.

(10) Patent No.: US 11,275,156 B2
(45) Date of Patent: Mar. 15, 2022

(54) SENSOR AND DISTANCE MEASURING DEVICE COMPRISING FIRST AND SECOND QUENCHING DEVICES RESPECTIVELY CONNECTED TO CURRENT OUTPUT TERMINALS OF FIST AND SECOND AVALANCHE PHOTODIODES

(71) Applicants: KABUSHIKI KAISHA TOSHIBA, Tokyo (JP); Toshiba Electronic Devices & Storage Corporation, Tokyo (JP)

(72) Inventors: Hiroshi Kubota, Fussa Tokyo (JP); Nobu Matsumoto, Ebina Kanagawa (JP)

(73) Assignees: KABUSEIIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 388 days.

(21) Appl. No.: 16/551,283

(22) Filed: Aug. 26, 2019

(65) Prior Publication Data

US 2020/0292670 A1 Sep. 17, 2020

(30) Foreign Application Priority Data

Mar. 13, 2019 (JP) .............................. JP2019-046282

(51) Int. Cl.
| | |
|---|---|
| *H01L 31/02* | (2006.01) |
| *G01S 7/481* | (2006.01) |
| *G01S 7/4863* | (2020.01) |
| *G01S 17/10* | (2020.01) |
| *H01L 27/144* | (2006.01) |

(Continued)

(52) U.S. Cl.
CPC .......... *G01S 7/4816* (2013.01); *G01S 7/4863* (2013.01); *G01S 17/10* (2013.01); *H01L 27/1443* (2013.01); *H01L 27/1446* (2013.01); *H01L 31/02027* (2013.01); *H01L 31/02164* (2013.01); *H01L 31/107* (2013.01)

(58) Field of Classification Search
CPC ... G01S 17/10; G01S 7/4863; H01L 27/1443; H01L 27/1446; H01L 31/02027; H01L 31/02164; H01L 31/107
USPC .................................. 250/214 R, 221, 214.1
See application file for complete search history.

(56) References Cited

U.S. PATENT DOCUMENTS

| | | | | |
|---|---|---|---|---|
| 8,269,181 B2 * | 9/2012 | Saveliev | ........... | H01L 27/14658 250/370.01 |
| 2018/0120152 A1 | 5/2018 | Leonardo | | |
| 2018/0266881 A1 | 9/2018 | Fujiwara et al. | | |

FOREIGN PATENT DOCUMENTS

| | | |
|---|---|---|
| JP | 2002-168806 A | 6/2002 |
| JP | 2012-089738 A | 5/2012 |
| JP | 2013-084972 A | 5/2013 |

* cited by examiner

*Primary Examiner* — Que Tan Le
(74) *Attorney, Agent, or Firm* — Foley & Lardner LLP (57) ABSTRACT

According to one embodiment, a sensor includes a first avalanche photodiode, a first quenching element, a second avalanche photodiode, and a second quenching element. The first quenching element is connected to a current output terminal of the first avalanche photodiode at one end and is connected to an output terminal at another end. The second avalanche photodiode is arranged adjacent to the first avalanche photodiode. The second quenching element is connected to a current output terminal of the second avalanche photodiode at one end and is connected to a specific electric potential at another end.

12 Claims, 6 Drawing Sheets

(51) Int. Cl.
*H01L 31/0216* (2014.01)
*H01L 31/107* (2006.01)

SENSOR AND DISTANCE MEASURING DEVICE COMPRISING FIRST AND SECOND QUENCHING DEVICES RESPECTIVELY CONNECTED TO CURRENT OUTPUT TERMINALS OF FIST AND SECOND AVALANCHE PHOTODIODES

CROSS-REFERENCE TO RELATED APPLICATION

This application is based upon and claims the benefit of priority from Japanese Patent Application No. 2019-046282, filed Mar. 13, 2019, the entire contents of which are incorporated herein by reference.

FIELD

Embodiments described herein relate generally to a sensor and a distance measuring device including the sensor.

BACKGROUND

A distance measuring device called light detection and ranging (LIDAR) is known. LIDAR radiates laser light to a target object, detects the intensity of reflective light reflected from the target object by a sensor, and measures a distance to the target object based on a light intensity signal output from the sensor. A sensor that uses a photomultiplier element using a semiconductor, particularly, a silicon photomultiplier element (SiPM), is known as the sensor used in LIDAR. Such a sensor has high sensitivity. In a case where the sensor receives a high intensity of light, output continues for a larger amount of time than typical output, and the subsequent measurement may not be easily performed. The output may act as a noise and degrade performance (S/N ratio). The cause of such a case is such that a carrier caused by light hitting the surrounding area (semiconductor) of the sensor is generated, secondary photons generated in the sensor are absorbed in the surrounding area of the sensor and generate the carrier, or the carrier generated in the sensor is accumulated in the surrounding area of the sensor.

An example of related art includes JP-A-2012-089738.

DETAILED DESCRIPTION

Embodiments provide a sensor having a small amount of unusable time and less performance degradation and performing a stable operation even in a case where a high intensity of light is incident, and a distance measuring device including the sensor.

In general, according to one embodiment, a sensor includes a first avalanche photodiode, a first quenching device, a second avalanche photodiode, and a second quenching device. The first quenching device has a first end and a second end. The first end of the first quenching device is connected to a current output terminal of the first avalanche photodiode, and the second end of the first quenching device is connected to a pixel terminal. The second avalanche photodiode is arranged adjacent to the first avalanche photodiode. The second quenching device has a first end and a second end. The first end of the second quenching device is connected to a current output terminal of the second avalanche photodiode, and the second end of the second quenching device is connected to an electric potential. The electric potential may be set at a certain value.

Hereinafter, embodiments will be described with reference to the drawings.

First Embodiment

Figure 1:
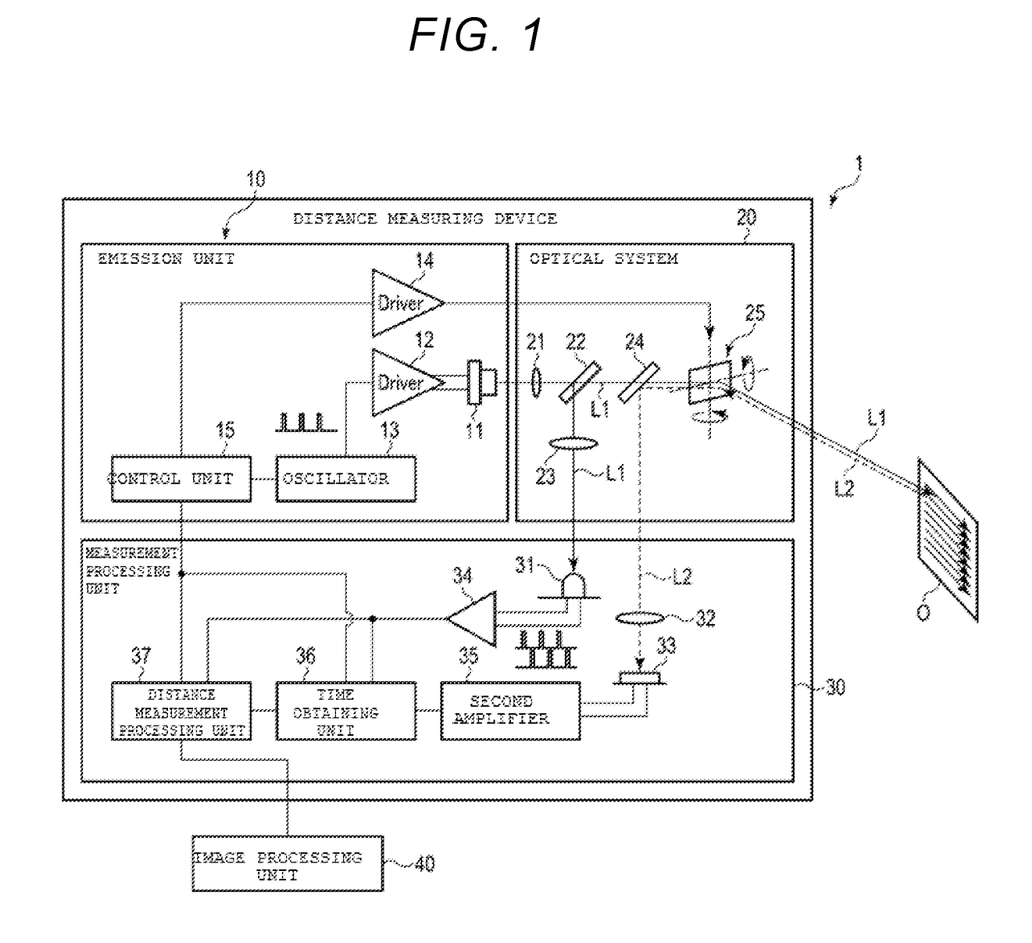
FIG. 1 is a diagram illustrating a schematic overall configuration of a distance measuring device according to each embodiment.

FIG. 1 is a diagram illustrating a schematic overall configuration of a distance measuring device according to each embodiment. A distance measuring device 1 includes an emission unit (or a light emitter) 10, an optical system 20, a measurement processing unit (or a distance measurement processor) 30, and an image processing unit (or an image processor) 40. It should be appreciated that the emission unit 10, the measurement processing unit 30, and image processing unit 40 and respective components included therein according to the present embodiment may be implemented by hardware or software. As for hardware, as appropriate, it may be a circuit (e.g., circuitry of a CPU, GPU, FPGA, or other processing circuits implemented using electronic circuits), or a processor (e.g., CPU, GPU, and the like) with a memory configured to implement the identified component herein.

The emission unit 10 intermittently emits laser light L1. The emission unit 10 includes a light source 11, a first drive circuit 12, an oscillator 13, a second drive circuit 14, and a control unit 15.

The light source 11 intermittently emits the laser light L1. The light source 11 is a laser light source such as a laser diode.

For example, the first drive circuit 12 supplies a drive current for driving the light source 11 to the light source 11. The first drive circuit 12 outputs the drive current depending on a pulse signal generated in the oscillator 13.

The oscillator 13 generates the pulse signal under control of the control unit 15. The oscillator 13 outputs the generated pulse signal to the first drive circuit 12.

The second drive circuit 14 supplies a drive current for driving a mirror 25 of the optical system 20 to the mirror 25 under control of the control unit 15.

For example, the control unit 15 includes a CPU and a memory. The memory stores a program for operating the distance measuring device 1. The CPU controls the first drive circuit 12 and the second drive circuit 14 in accordance with the program stored in the memory.

The optical system 20 emits the laser light L1 emitted from the emission unit 10 to a target object O and causes reflective light L2 of the laser light L1 reflected from the target object O to be incident on the measurement processing unit 30. The optical system 20 includes a lens 21, a first optical element 22, a lens 23, a second optical element 24, and the mirror 25.

The lens 21 is arranged on an emission optical path of light emitted from the light source 11. The lens 21 collimates the laser light L1 intermittently emitted from the light source 11 and guides the laser light L1 to the first optical element 22.

The first optical element 22 separates the laser light L1 guided by the lens 21 in the direction of the second optical element 24 and the direction of a photosensor 31 of the measurement processing unit 30. For example, the first optical element 22 is a beam splitter.

The lens 23 condenses the laser light L1 emitted from the first optical element 22 and guides the laser light L1 to the photosensor 31.

The second optical element 24 transmits the laser light L1 emitted from the first optical element 22 in the direction of the mirror 25 and reflects the reflective light L2 of the laser light L1 emitted from the mirror 25 in the direction of the sensor 33 of the measurement processing unit 30. For example, the second optical element 24 is a half mirror.

The mirror 25 reflects incident light. For example, reflective surfaces of the mirror 25 are configured to be rotatable about two rotating shafts intersecting with each other. The mirror 25 is driven in accordance with the drive current supplied from the second drive circuit 14.

The measurement processing unit 30 measures a distance to the target object O based on the reflective light L2 emitted from the optical system 20. The measurement processing unit 30 includes the photosensor 31, a lens 32, a sensor 33, a first amplifier 34, a second amplifier 35, a time obtaining unit 36, and a distance measurement processing unit 37.

For example, the photosensor 31 is a photodiode and outputs an electric signal by receiving the laser light L1 guided through the lens 23.

The lens 32 condenses the reflective light L2 from the second optical element 24 and guides the reflective light L2 to the sensor 33.

The sensor 33 outputs an electric signal by receiving the reflective light L2 entered from the lens 32. For example, the sensor 33 is a photomultiplier element using a semiconductor and is particularly a silicon photomultiplier element (SiPM). The SiPM is a device in which an avalanche photodiode (APD) called a single-photon avalanche diode (SPAD) and used in Geiger-mode is disposed in a multi-pixel form. Each SPAD causes avalanche breakdown in response to light incidence and outputs an electric signal. A configuration of the sensor 33 will be described in detail below.

The first amplifier 34 amplifies the electric signal output from the photosensor 31 and outputs the electric signal to the time obtaining unit 36 and the distance measurement processing unit 37.

For example, the second amplifier 35 is a transimpedance amplifier and amplifies the electric signal based on the reflective light L2. For example, the second amplifier 35 amplifies and converts a current signal output from the sensor 33 into a voltage signal as a measurement signal.

The time obtaining unit 36 generates a time series signal with respect to signal intensity by performing AD conversion on the measurement signal based on the reflective light L2. Alternatively, the time obtaining unit 36 may obtain a rise time of the measurement signal.

The distance measurement processing unit 37 detects a peak time of the time series signal obtained by the time obtaining unit 36 and measures the distance to the target object O based on a difference in time between the peak time and a radiation timing of the laser light L1 or a difference in time between the rise time and the radiation timing of the laser light L1.

Figure 2:
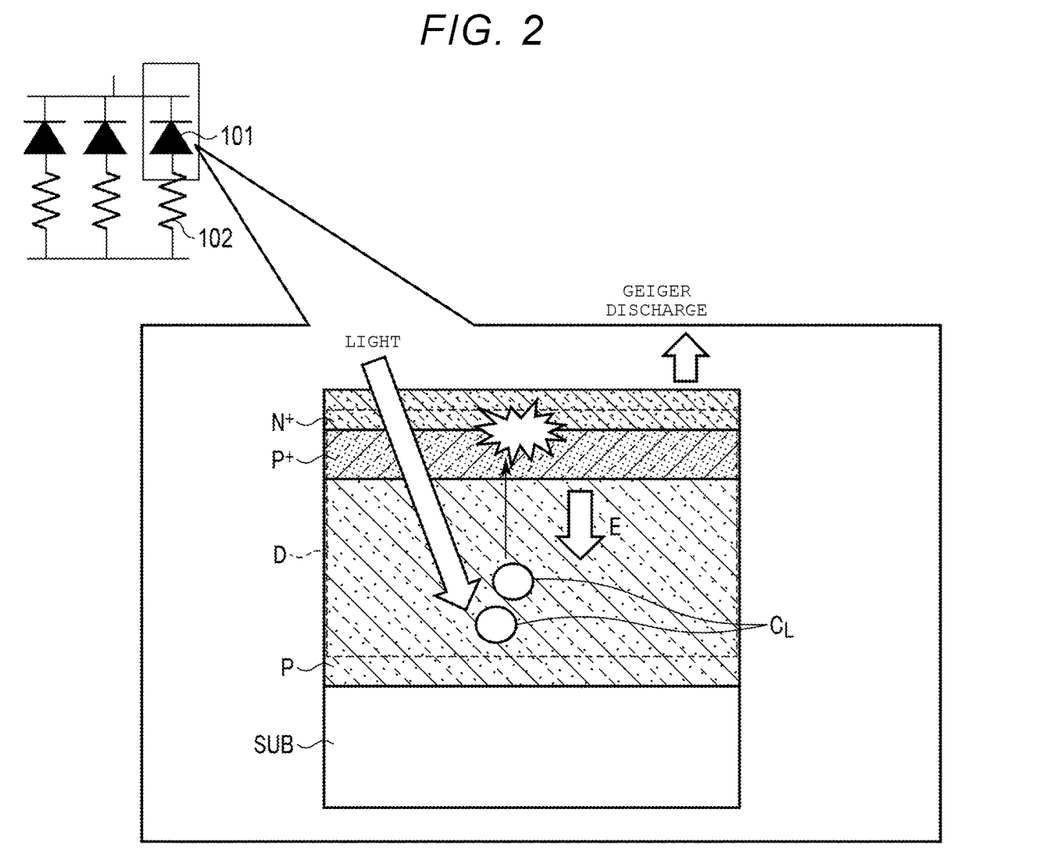
FIG. 2 is a diagram illustrating a configuration and an operation principle of one SPAD.

Hereinafter, a configuration of the sensor 33 will be described. FIG. 2 is a diagram illustrating a configuration and an operation principle of the SPAD. One SPAD includes an APD 101 and a quench resistor 102. One end of the quench resistor 102 is connected to a current output terminal (in the example in FIG. 2) of the APD 101, which is sometimes referred to as a cathode. Alternatively, a quenching device (active quench circuit) that uses a transistor may be used instead of the quench resistor. In the present specification, the quench resistor and the active quench circuit will be collectively referred to as a quenching element.

The APD 101 in the example in FIG. 2 includes a thick P-type semiconductor layer and a thin N-type semiconductor layer. Specifically, for example, the APD 101 includes a substrate SUB, a P-type semiconductor layer P, a P-plus-type semiconductor layer $P^+$, and an N-plus-type semiconductor layer $N^+$. For example, the substrate SUB is a P-type semiconductor substrate. The P-type semiconductor layer P is stacked on the substrate SUB. The P-type semiconductor layer P is a P-type semiconductor (epi) layer having a lower impurity concentration than the P-plus-type semiconductor layer $P^+$. The P-plus-type semiconductor layer $P^+$ is a semiconductor layer in which a P-type impurity is introduced in order to have a higher impurity concentration than the P-type semiconductor layer P. The N-plus-type semiconductor layer $N^+$ is a semiconductor layer of a high impurity concentration in which an N-type impurity is introduced. Electrodes, not illustrated, are formed in the N-plus-type semiconductor layer $N^+$. A high reverse-bias voltage is applied to the APD 101 through the electrodes in a direction in which the substrate side is negative.

As illustrated in FIG. 2, a depletion layer D is formed near a junction (PN junction) region between the P-type semiconductor layer and the N-type semiconductor layer. In a case where light is incident on the depletion layer D or an outer region, an electron-positive hole pair as a carrier $C_L$ is generated in the depletion layer D or the outer region.

Since a high reverse-bias voltage is applied to the APD 101, the carrier $C_L$ generated in the depletion layer D drifts due to an electric field E caused by the reverse-bias voltage. In the example in FIG. 2, in the carrier $C_L$, the electron is accelerated in the direction of the surface (N-plus-type semiconductor layer $N^+$), and the positive hole is accelerated in the direction of the substrate. The electron accelerated toward the N-plus-type semiconductor layer $N^+$ collides with an atom under a strong electric field near the PN junction. The electron colliding with the atom ionizes the atom and generates a new electron-positive hole pair. In a case where the reverse-bias voltage exceeds a breakdown voltage, the generation of the electron-positive hole pair is repeated. Such avalanche breakdown causes the APD 101 to discharge. Such discharge is called Geiger discharge. In such a manner, an electric signal related to the Geiger discharge and subsequent recovery is output from one SPAD.

A current output from the APD 101 flows in the quench resistor 102. At this point, the bias voltage is decreased due to a decrease in voltage. In a case where the bias voltage is decreased and becomes less than the breakdown voltage, a Geiger phenomenon stops. Furthermore, in a case where a flow of recovery current charging a capacitance such as a PN junction capacitance of the APD 101 ends, the current output stops. In a case where the impact ionization stops and the bias voltage becomes greater than the breakdown voltage, the APD 101 returns to a state where subsequent light can be received.

The APD 101 is not limited to the structure in FIG. 2. For example, the P-plus-type semiconductor layer P+ may not be present. In addition, while the APD in FIG. 2 has a structure including a thick P-type semiconductor layer and a thin N-type semiconductor layer, the APD may conversely have a structure including a thick N-type semiconductor layer and a thin P-type semiconductor layer. Furthermore, the PN junction may not be created near the surface as in FIG. 2. The PN junction may be formed around a boundary between the substrate SUB and the epi layer.

Figure 3:
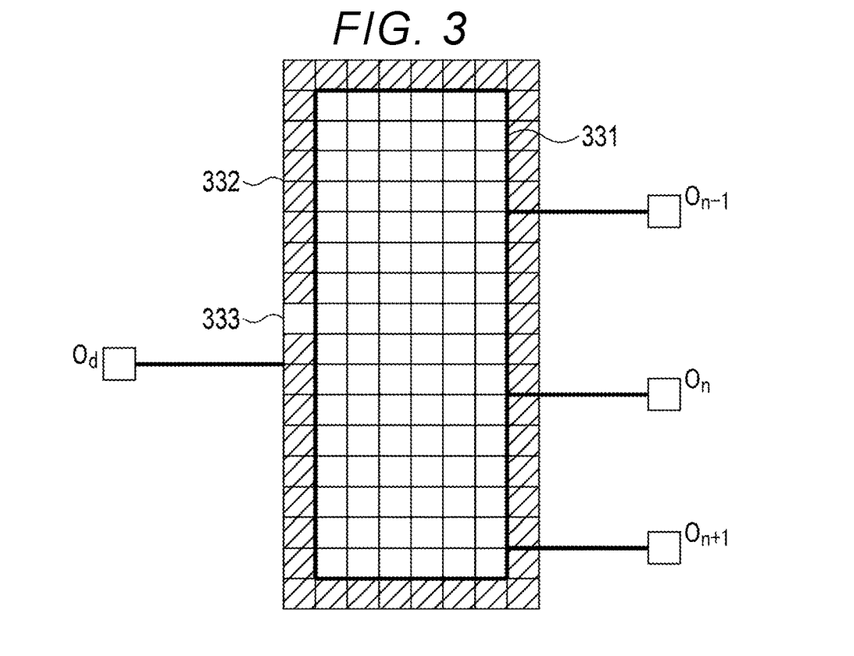
FIG. 3 is a diagram illustrating one configuration example of a sensor in a first embodiment.

FIG. 3 is a diagram illustrating one configuration example of the sensor 33 in a first embodiment. As illustrated in FIG. 3, the sensor 33 in the embodiment includes a sensor region 331 and a dummy SPAD 332.

One sensor region 331 includes a plurality of SPADs each including a first avalanche photodiode (APD) and a first quench resistor. As illustrated in FIG. 3, the sensor region 331 is two-dimensionally arranged and forms the sensor. The APD (first avalanche photodiode) of the sensor region 331 is respectively connected to the first quench resistor at one end and constitutes the SPAD. Another end of the first quench resistor is connected to an output terminal. In FIG. 3, the plurality of SPADs of the sensor region 331 are grouped into three pixels (channels in other words). The SPAD of a first pixel is connected in common to an output terminal $O_{n-1}$ through the first quench resistor. The SPAD of a second pixel is connected to an output terminal $O_n$ through another first quench resistor. The SPAD of a third pixel is connected to an output terminal $O_{n+1}$ through still another first quench resistor. Each of the output terminals $O_{n-1}$, $O_n$, and $O_{n+1}$ is connected to the second amplifier 35. In such a configuration, an electric signal corresponding to the total of the electric signal output from the SPADs of each pixel in the sensor region 331 belonging to the same sensor region is output to the second amplifier 35 from each of the output terminals $O_{n-1}$, $O_n$, and $O_{n+1}$. While the sensor region 331 in FIG. 3 includes three pixels, the number of pixels may be one or more.

A plurality of dummy SPADs 332 are disposed at the outer periphery of the sensor region. The dummy SPAD 332 is an SPAD including a second avalanche photodiode (APD) and a second quench resistor. The APD (second avalanche photodiode) of the dummy SPAD 332 is connected to one end of the second quench resistor. Another end of the second quench resistor is connected to an output terminal $O_d$ different from that of the sensor region 331. The output terminal $O_d$ is connected to a specific electric potential of the sensor 33, for example, the ground.

For example, the first APD and the second APD are elements having the same characteristics. As will be described below, the first APD and the second APD may be elements having different characteristics. In addition, for example, the first quench resistor and the second quench resistor are elements having the same resistance value. As will be described below, the first quench resistor and the second quench resistor may be elements having different resistance values.

In addition, while it is desirable to dispose the dummy SPAD 332 to surround the whole sensor region, the dummy SPAD 332 may not necessarily be disposed to surround the whole sensor region. As illustrated in FIG. 3, a gap 333 in which the SPAD is not present may be present in the dummy SPAD 332. The size of the gap 333 is not limited to the size of one pixel. For example, the dummy SPAD 332 may be disposed at only the left end and the right end of the sensor region, and only the gap 333 may be disposed at the upper end and the lower end of the sensor region. The size, number, and interval of gaps 333 may be set in any manner. In addition, while the dummy SPAD 332 is connected to the common output terminal $O_d$ in FIG. 3, the dummy SPAD 332 may be individually connected to a specific electric potential, for example, the ground.

Figure 4:
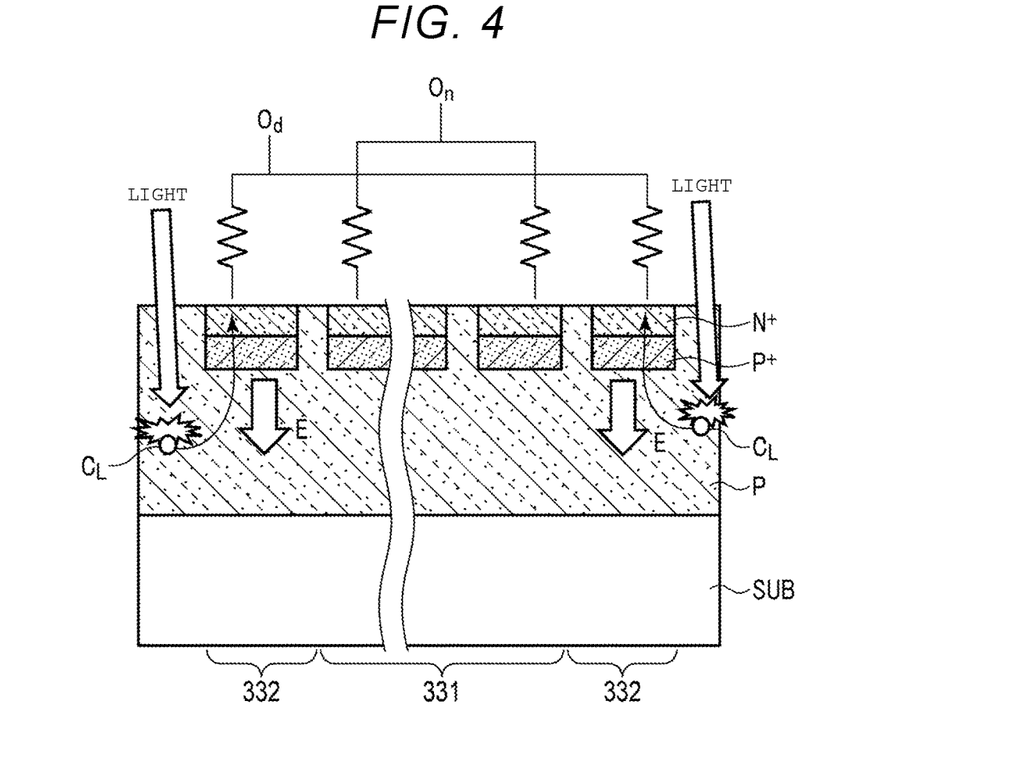
FIG. 4 is a diagram illustrating an effect of a dummy SPAD.

FIG. 4 is a diagram illustrating the effect of the dummy SPAD 332. By disposing the dummy SPAD 332 at the outer periphery of the sensor region, the carrier $C_L$ generated or accumulated outside the sensor region 331 by light incidence or the like from the outside of the sensor region is drifted due to the electric field E caused by the reverse-bias voltage applied to the dummy SPAD 332. Electrons, caused by drifting the carrier $C_L$, flow to a specific electric potential, for example, the ground, through the output terminal $O_d$.

In the present embodiment, a situation in which the carrier generated outside the sensor region 331 by light incidence from the outside of the sensor region reaches the sensor region 331 is reduced.

When a high intensity of light is incident on the SiPM, the carrier generated outside the sensor region 331 by light incidence from the outside of the sensor region reaches the sensor region 331 after a relatively large amount of time. Particularly, a large amount of time is taken when the carrier generated outside the sensor region 331 moves to the sensor region 331 by diffusion. The carrier generated outside the sensor region 331 may cause the sensor region 331 to continue outputting the electric signal even after the electric signal caused by direct incident light is output. The subsequent detection cannot be performed before the output of the electric signal by the SiPM is complete, or SN deteriorates. Thus, in a case where the output of the electric signal by the sensor region 331 takes for a large amount of time, the measurement of the distance may also be affected.

In the embodiment, it is unlikely that the carrier generated outside the sensor region 331 reaches the sensor region 331, and it is likely that the output of the electric signal by the SiPM is complete early. Accordingly, the subsequent detection is performed early, and performance is improved. Thus, even when a high intensity of light is incident, the sensor 33 operates more stably.

In addition, generally (even in a case where a high intensity of light is not incident), the electric signal caused by the carrier generated outside the sensor region 331 may be a noise with respect to the electric signal caused by light directly incident on the sensor region 331. In the embodiment, since the carrier generated outside the sensor region 331 does not easily reach the sensor region 331, such a noise is reduced.

Second Embodiment

Figure 5:
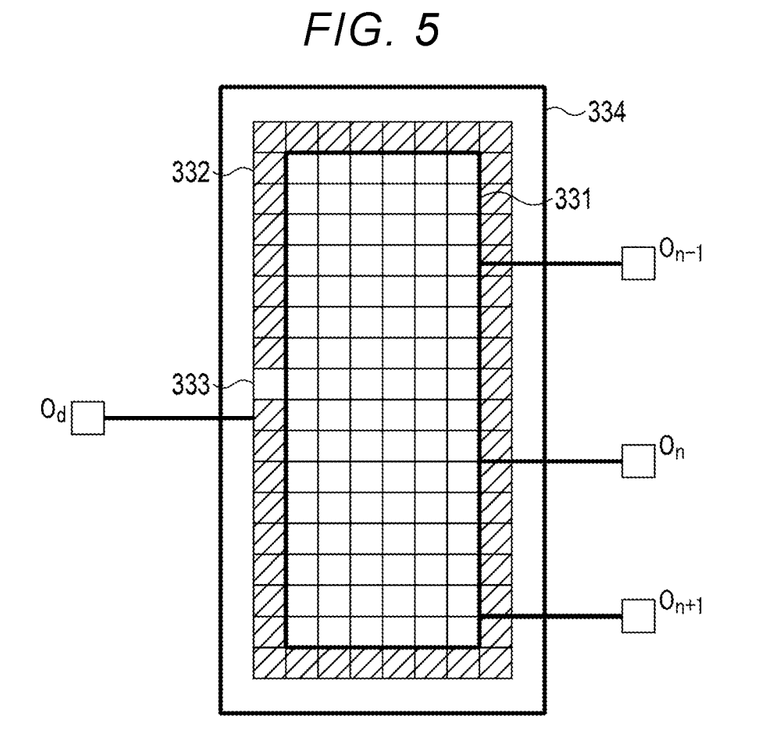
FIG. 5 is a diagram illustrating one configuration example of a sensor in a second embodiment.

Next, a second embodiment will be described. In the second embodiment, a configuration of a distance measuring device is the same as that of the first embodiment. Accordingly, such a description will not be repeated. FIG. 5 is a diagram illustrating one configuration example of the sensor 33 in the second embodiment. As illustrated in FIG. 5, the sensor 33 in the embodiment includes the sensor region 331 and the dummy SPAD 332. The sensor region 331 and the dummy SPAD 332 are the same as those of the first embodiment.

In the second embodiment, a light shielding layer 334 is disposed on the dummy SPAD 332. For example, the light shielding layer 334 is an aluminum (Al) layer and prevents light incidence on the dummy SPAD 332. The material of the light shielding layer 334 is not particularly limited, provided that the material has a light shielding property like a resist material. In addition, it is desirable that the light shielding layer covers not only the dummy SPAD 332 but also the semiconductor around the dummy SPAD 332.

Figure 6:
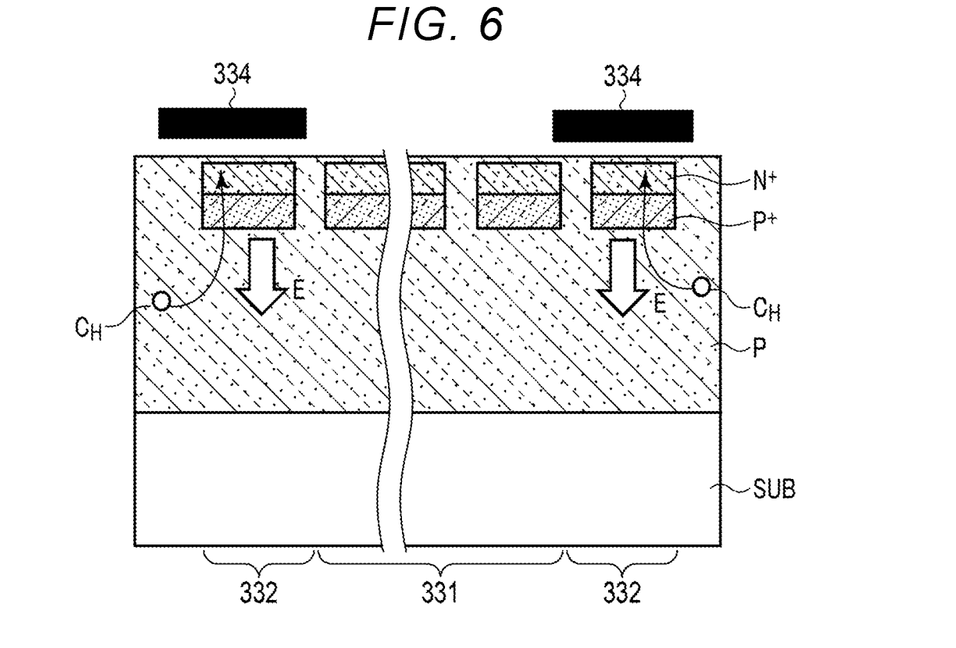
FIG. 6 is a diagram illustrating an effect of a light shielding layer.

FIG. 6 is a diagram illustrating the effect of the light shielding layer 334. By disposing the light shielding layer 334 on the dummy SPAD 332 and the surrounding area of the dummy SPAD 332, incidence of light from the outside of the sensor region 331 on the dummy SPAD 332 and the surrounding area of the dummy SPAD 332 is reduced. Thus, the carrier generated outside the sensor region 331 generally includes a carrier $C_H$ excited by heat and a carrier generated by secondary photons. The number of such carriers is smaller than the number of carriers $C_L$ excited by light incidence of a high intensity.

In a case where the dummy SPAD 332 is excited by light incidence of a high intensity or the like, the bias voltage of the dummy SPAD 332 is decreased. At this point, acceleration of the carrier generated outside the sensor region 331 of the dummy SPAD 332 is weakened, and the performance of collecting the carrier of the dummy SPAD 332 is decreased. In the second embodiment, the number of carriers generated outside the sensor region 331 is small. Thus, the dummy SPAD 332 is not easily excited. Accordingly, in the second embodiment, it is more unlikely that the carrier generated outside the sensor region 331 reaches the sensor region 331 than that in the first embodiment. Furthermore, optical cross talks caused by the dummy SPAD 332 can also be reduced.

Modification Example 1

The dummy SPAD 332 itself may be configured to be unlikely to be excited. For example, the dummy SPAD 332 may be configured such that the avalanche breakdown is not easily caused. Alternatively, the dummy SPAD 332 may be configured such that the quench is complete early. Modification Example 1 may be applied to any of the first embodiment and the second embodiment.

In order not to easily cause the avalanche breakdown, for example, the breakdown voltage of the dummy SPAD 332 may be higher than the breakdown voltage of the sensor region 331. Accordingly, the dummy SPAD 332 does not easily cause the avalanche breakdown, compared to the sensor region 331.

Figure 7A:
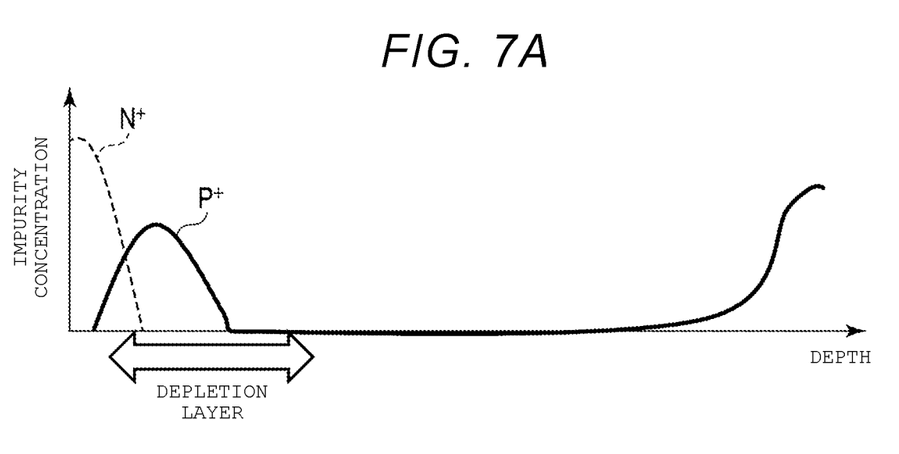
FIG. 7A is a diagram illustrating an example of an impurity concentration with respect to a layer depth with the surface of an APD of a pixel as a reference.
Figure 7B:
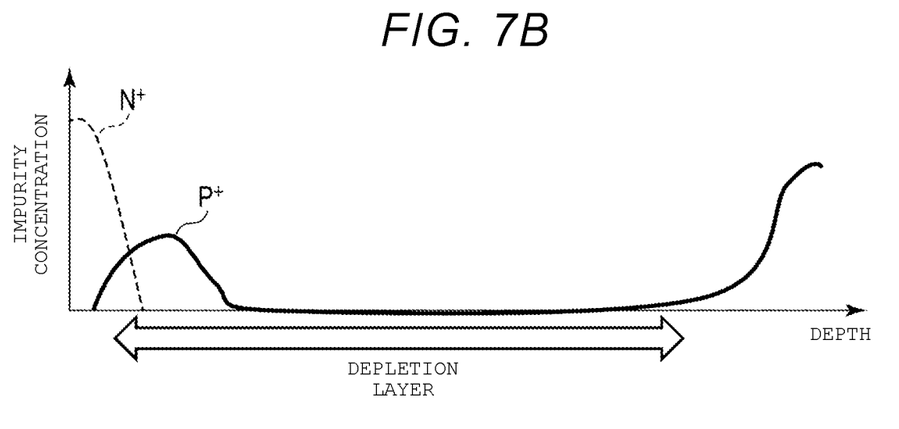
FIG. 7B is a diagram illustrating a first example of the impurity concentration with respect to the layer depth with the surface of an APD of the dummy SPAD as a reference.
Figure 7C:
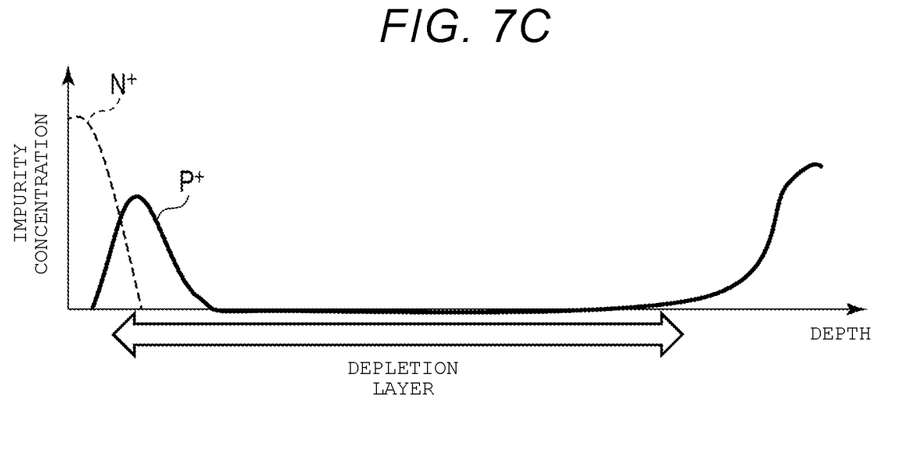
FIG. 7C is a diagram illustrating a second example of the impurity concentration with respect to the layer depth with the surface of the APD of the dummy SPAD as a reference.

For example, the breakdown voltage can be changed by changing the impurity concentration in the P-plus-type semiconductor layer $P^+$. FIG. 7A is a diagram illustrating P-type and N-type impurity concentrations with respect to a layer depth with the surface of the APD of the sensor region 331 as a reference. FIG. 7B is a diagram illustrating the P-type and N-type impurity concentrations of a first example with respect to the layer depth with the surface of the APD of the dummy SPAD 332 as a reference. FIG. 7C is a diagram illustrating the P-type and N-type impurity concentrations of a second example with respect to the layer depth with the surface of the APD of the dummy SPAD 332 as a reference.

For example, when the impurity concentration in the N-plus-type semiconductor layer $N^+$ and the impurity concentration in the P-plus-type semiconductor layer $P^+$ in the sensor region 331 are as illustrated in FIG. 7A, the impurity concentration in the P-plus-type semiconductor layer $P^+$ of the dummy SPAD 332 may be changed as in the first example illustrated in FIG. 7B. That is, the impurity concentration on a deeper side (substrate SUB side) in the P-plus-type semiconductor layer $P^+$ of the dummy SPAD 332 may be decreased below the impurity concentration on a deeper side (substrate SUB side) in the P-plus-type semiconductor layer $P^+$ of the sensor region 331. By doing so, the depth of the depletion layer is increased. Consequently, the breakdown voltage is also increased. For example, the impurity concentration can be changed by adjusting the dose amount of impurity in ion implantation for forming the P-plus-type semiconductor layer $P^+$. The P-plus-type semiconductor layer $P^+$ may not be formed by setting the dose amount in the ion implantation to zero.

In addition, for example, the breakdown voltage can be changed by changing the depth of the P-plus-type semiconductor layer $P^+$. For example, when the impurity concentration in the N-plus-type semiconductor layer $N^+$ and the impurity concentration in the P-plus-type semiconductor layer $P^+$ in the sensor region 331 are as illustrated in FIG. 7A, the depth of the P-plus-type semiconductor layer $P^+$ of the dummy SPAD 332 may be changed as in the second example illustrated in FIG. 7C. That is, the depth of the P-plus-type semiconductor layer $P^+$ of the dummy SPAD 332 may be smaller than the depth of the P-plus-type semiconductor layer $P^+$ of the sensor region 331. By doing so, the depth of the depletion layer is increased. Consequently, the breakdown voltage is also increased. For example, the depth of the P-plus-type semiconductor layer $P^+$ can be changed by making the P-plus-type semiconductor layer $P^+$ thin in the ion implantation for forming the P-plus-type semiconductor layer.

In addition, the resistance value of the quench resistor of the dummy SPAD 332 may be higher than the resistance value of the quench resistor of the sensor region 331. Accordingly, even in a case where the dummy SPAD 332 causes the avalanche breakdown, quenching finishes early. Accordingly, the dummy SPAD 332 returns early to a state where the carrier can be collected more favorably.

In addition, the reverse-bias voltage of the dummy SPAD 332 may be lower than the reverse-bias voltage of the sensor region 331.

As described thus far, in Modification Example 1, the dummy SPAD 332 is not easily excited. Accordingly, it is unlikely that the carrier generated outside the sensor region 331 reaches the sensor region 331.

Modification Example 2

Figure 8:
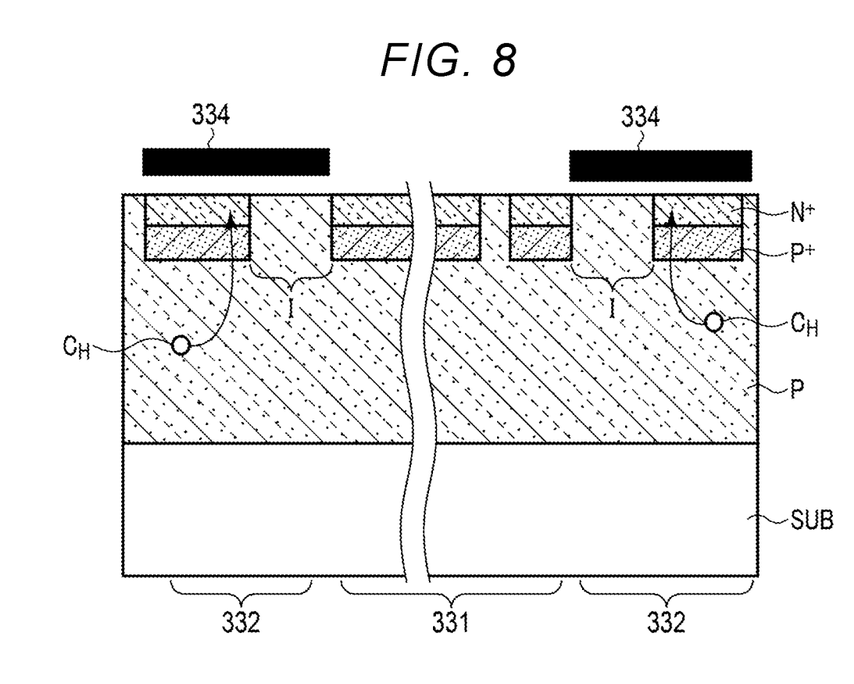
FIG. 8 is a diagram illustrating a modification example in which an interval is disposed between the pixel and the dummy SPAD.

In the above embodiments, the sensor region 331 and the dummy SPAD 332 are adjacent to each other. Meanwhile, as illustrated in FIG. 8, a certain empty interval I may be present between the sensor region 331 and the dummy SPAD 332. The width of the interval I may be equal to the width of one pixel, for example, approximately 2 μm to 10 μm. In actuality, the width of the interval I may be determined depending on the wavelength of light that may be incident on the sensor region 331 and the dummy SPAD 332. In the interval I, either any element may not be formed, an element separation structure such as a trench structure or LOCOS may be created, or a dummy SPAD to which the reverse-bias voltage is not applied may be formed.

By setting the empty interval I, crosstalk in which the carrier not collected in the dummy SPAD 332 reaches the sensor region 331 is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor comprising:
a first avalanche photodiode;
a first quenching device having a first end and a second end, the first end of the first quenching device connected to a current output terminal of the first avalanche photodiode and the second end of the first quenching device connected to a pixel terminal;
a second avalanche photodiode arranged adjacent to the first avalanche photodiode; and
a second quenching device having a first end and a second end, the first end of the second quenching device connected to a current output terminal of the second avalanche photodiode and the second end of the second quenching device connected to an electric potential.

2. The sensor according to claim 1,
wherein the first avalanche photodiode is one of a plurality of first avalanche photodiodes that are two-dimensionally arranged over a substrate and form a sensor region over the substrate, and
the second avalanche photodiode is one of a plurality of second avalanche photodiodes that are arranged over the substrate and around an outer periphery of the sensor region.

3. The sensor according to claim 1,
wherein the first avalanche photodiode is one of a plurality of first avalanche photodiodes that are two-dimensionally arranged over a substrate and form a sensor region over the substrate, and
the second avalanche photodiode is not arranged around a portion of the outer periphery of the sensor region.

4. The sensor according to claim 1,
wherein the second avalanche photodiode is light-shielded.

5. The sensor according to claim 1,
wherein a breakdown voltage of the second avalanche photodiode is higher than a breakdown voltage of the first avalanche photodiode.

6. The sensor according to claim 1,
wherein a resistance value of the second quenching device is higher than a resistance value of the first quenching device.

7. The sensor according to claim 1,
wherein a reverse-bias voltage of the second avalanche photodiode is lower than a reverse-bias voltage of the first avalanche photodiode.

8. A distance measuring device comprising:
a light emitter configured to emit light toward a target object;
a sensor configured to receive light reflected from the target object; and
a distance measurement processor configured to measures a distance to the target object based on a current signal provided by the sensor, wherein the sensor includes:
a first avalanche photodiode;
a first quenching device having a first end and a second end, the first end of the first quenching device connected to a current output terminal of the first avalanche photodiode and the second end of the first quenching device connected to a pixel terminal configured to output the current signal;
a second avalanche photodiode arranged adjacent to the first avalanche photodiode; and
a second quenching device having a first end and a second end, the first end of the second quenching device connected to a current output terminal of the second avalanche photodiode and the second end of the second quenching device connected to an electric potential.

9. The sensor according to claim 1, further comprising:
a light shielding layer, disposed over the substrate, that is configured to reduce light incidence received by the first and second avalanche photodiodes.

10. The sensor according to claim 1, wherein the electric potential is ground.

11. The sensor according to claim 1, wherein each of the first and second quenching devices includes at least one of a resistor or a transistor.

12. The distance measuring device according to claim 8, wherein each of the first and second quenching devices includes at least one of a resistor or a transistor.

* * * * *